United States Patent
Lacord et al.

(10) Patent No.: US 10,622,058 B2
(45) Date of Patent: Apr. 14, 2020

(54) METHOD FOR PROGRAMMING A ONE-TRANSISTOR DRAM MEMORY CELL AND MEMORY DEVICE

(71) Applicant: COMMISSARIAT A L'ENERGIE ATOMIQUE ET AUX ENERGIES ALTERNATIVES, Paris (FR)

(72) Inventors: Joris Lacord, Saint Blaise du Buis (FR); François Tcheme Wakam, Sain-Martin-d'Hères (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 16/120,858

(22) Filed: Sep. 4, 2018

(65) Prior Publication Data

US 2019/0074050 A1    Mar. 7, 2019

(30) Foreign Application Priority Data

Sep. 4, 2017  (FR) ..................................... 17 58122

(51) Int. Cl.
*G11C 11/4096* (2006.01)
*H01L 27/108* (2006.01)
(Continued)

(52) U.S. Cl.
CPC ........ *G11C 11/4096* (2013.01); *G11C 11/404* (2013.01); *G11C 11/409* (2013.01);
(Continued)

(58) Field of Classification Search
CPC . G11C 11/4096; G11C 11/404; G11C 11/409; H01L 27/10802; H01L 29/1079; H01L 29/1095
See application file for complete search history.

(56) References Cited

U.S. PATENT DOCUMENTS 7,851,859 B2 * 12/2010  Tak ........................ H01L 27/108
                                                          257/347
8,014,195 B2 *  9/2011  Okhonin ............... G11C 11/404
                                                          365/149
(Continued)

FOREIGN PATENT DOCUMENTS

EP       2764550 B1     8/2016
FR       2958779 A1    10/2011

OTHER PUBLICATIONS

Search Report as issued in French Patent Application No. 1758122, dated May 18, 2018.
(Continued)

*Primary Examiner* — Tri M Hoang
(74) *Attorney, Agent, or Firm* — Pillsbury Winthrop Shaw Pittman LLP (57) ABSTRACT

A method for programming a one-transistor dynamic memory cell of A2RAM type. The A2RAM memory cell includes a source and a drain doped of a first conductivity type, a body region arranged between the source and the drain, and an insulated gate arranged facing the body region. The body region includes first and second portions extending parallel to the insulated gate, the first portion being doped of a second conductivity type opposite to the first conductivity type and arranged between the insulated gate and the second portion, doped of the first conductivity type. The programming method includes biasing the transistor in an off state by electrical potentials applied to the drain and the gate. The drain potential and the gate potential are chosen in such a way as to create charge carriers by impact ionisation in the second portion.

8 Claims, 4 Drawing Sheets

(51) Int. Cl.
   *H01L 29/10*   (2006.01)
   *G11C 11/404*  (2006.01)
   *G11C 11/409*  (2006.01)

(52) U.S. Cl.
   CPC .... *H01L 27/10802* (2013.01); *H01L 29/1079* (2013.01); *H01L 29/1095* (2013.01); *G11C 2211/4016* (2013.01)

(56) References Cited

U.S. PATENT DOCUMENTS

| | | | | |
|---|---|---|---|---|
| 8,194,487 | B2* | 6/2012 | Carman | G11C 11/406 |
| | | | | 365/177 |
| 8,947,932 | B2* | 2/2015 | Lee | H01L 27/108 |
| | | | | 257/298 |
| 9,099,544 | B2* | 8/2015 | Rodriguez | G11C 11/404 |
| 9,166,051 | B2* | 10/2015 | Cristoloveanu | G11C 11/404 |
| 2008/0303063 | A1* | 12/2008 | Hong | H01L 27/108 |
| | | | | 257/192 |
| 2011/0042746 | A1 | 2/2011 | Tak et al. | |
| 2012/0113730 | A1* | 5/2012 | Cristoloveanu | G11C 11/404 |
| | | | | 365/189.011 |
| 2013/0148441 | A1 | 6/2013 | Cristoloveanu et al. | |

OTHER PUBLICATIONS

Han, J.-W., et al., "A Bulk FinFET Unified-RAM (URAM) Cell for Multifunctioning NVM and Capacitorless 1T-DRAM," IEEE Electron Device Letters, vol. 29, No. 6, Jun. 2008, XP011215166, pp. 632-634.

Rodriguez, N., et al., "Novel Capacitorless 1T-DRAM Cell for 22-nm Node Compatible With Bulk and SOI Substrates," IEEE Transactions on Electron Devices, vol. 58, No. 8, Aug. 2011, XP011336295, pp. 2371-2377.

Rodriguez, N., et al., "New Concepts for 1T-DRAMS: Overcoming the Scaling Limits," International Semiconductor Conference (CAS), Oct. 2011, XP032069132, pp. 11-14.

* cited by examiner

METHOD FOR PROGRAMMING A ONE-TRANSISTOR DRAM MEMORY CELL AND MEMORY DEVICE

CROSS REFERENCE TO RELATED APPLICATIONS

This application claims priority to French Patent Application No. 1758122, filed Sep. 4, 2017, the entire content of which is incorporated herein by reference in its entirety.

FIELD

The present invention relates to dynamic random access memories, also known by the acronym DRAM. The invention more particularly relates to a method for programming a one-transistor DRAM memory cell (1T-DRAM).

BACKGROUND

DRAM memory cells are conventionally comprised of a MOS transistor and a capacitor. Despite this simple structure, DRAM memory cells are difficult to miniaturise, the difficulty mainly residing in the reduction of the size of the capacitors. To overcome this difficulty, memory cells comprised of a single transistor, without capacitor, have been elaborated, the MOS transistor having a junction-insulated body or a insulator-insulated body in semiconductor on insulator (SOI) or semiconductor on nothing (SON) technologies. In these so-called "1T-DRAM" memory cells, the memory function corresponds to a storage of charges in the body of the transistor.

1T-DRAM memory cells suffer for the most part from considerable drawbacks, among which may be cited a limited retention duration, a high consumption, a low differentiation between the two memory states, a low operating speed, the impossibility of reducing the thickness of the transistor body which has to ensure the simultaneous presence of two types of charge carriers (electrons and holes), and/or manufacturing difficulties.

The "A2RAM" memory cell architecture, described in the patent FR2958779 and the article ["Novel Capacitorless 1T-DRAM Cell for 22-nm Node Compatible With Bulk and SOI Substrates", N. Rodriguez et al., IEEE Transactions on Electron Devices, Volume 58, Issue 8, 2011], is on the contrary distinguished by a controlled consumption, a wide programming window, a simple control and the absence of super-coupling, that is to say the impossibility of having the two types of charge carriers in a thin silicon layer (typically of thickness less than 20 nm).

Figure 1:
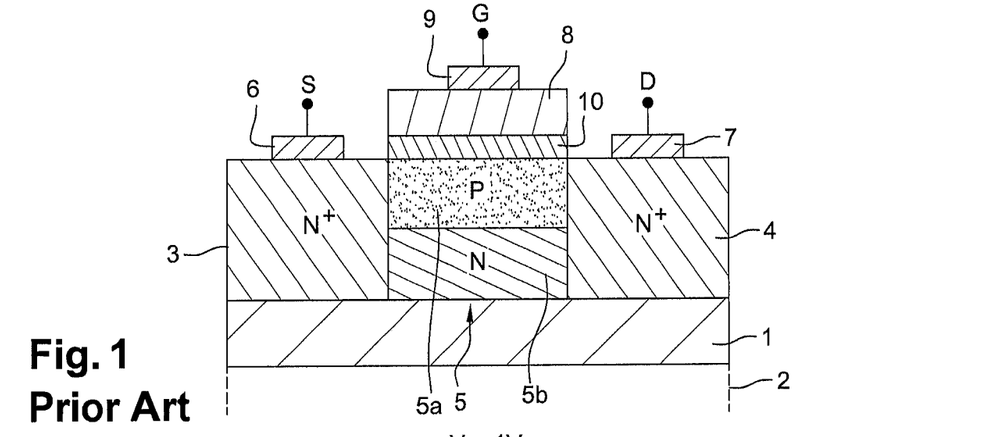
FIG. 1 schematically represents a one-transistor dynamic memory cell of A2RAM-type.

FIG. 1 is a sectional view schematically representing an A2RAM type memory cell.

The A2RAM memory cell is comprised of a MOS transistor resting on an insulator layer 1, typically the buried oxide layer of a SOI type substrate 2. In a conventional manner, the MOS transistor comprises a source region 3 and a drain region 4 strongly doped of a first conductivity type, for example of N type, and separated by a body region 5. The source 3 and drain 4 regions are respectively in contact with source 6 and drain 7 metallisations, connected respectively to source S and drain D terminals. The body region 5 is surmounted by a gate 8 connected to a gate terminal G through a gate metallisation 9. The gate 8 is electrically insulated from the body region 5 by a dielectric layer 10, typically a gate oxide.

The particularity of this MOS transistor is that the body region 5 is divided in its thickness into an upper body region 5a on the side of the gate 8 and a lower body region 5b in the vicinity of the insulator layer 1. The upper body region 5a, also called "channel region" or "storage node", is weakly doped of a second conductivity type opposite to the first type, i.e. of P type in this example. The lower body region 5b is doped of the same conductivity type as the source and drain 3-4 regions, i.e. of N type. It is commonly called "conductive bridge" since it electrically connects, in the absence of bias on the gate, the source 3 and the drain 4.

The operating principle of this memory cell is as follows. An information bit is memorised by controlling the quantity of majority charge carriers stored in the upper body region 5a. Thus, two memory states may be distinguished: the logic state '1' when the upper body region 5a contains majority charge carriers (holes in the case of a P type doped upper body region 5a) and the logic state '0' when the upper body region 5a is empty of majority charge carriers.

The information stored in the memory cell is read by measuring the current that circulates in the resistance formed by the source 3, the lower body region 5b and the drain 4 (all three N type doped). To do so, a negative potential is applied to the gate 8 and a slightly positive potential is applied to the drain 4. In the case where a '0' state has been programmed, that is to say that no charge is stored in the upper body region 5a, no current circulates in the upper body region 5a because the transistor is off (there is thus no formation of the conductive channel). Furthermore, the negative potential of the gate 8 depletes the lower body region 5b which thus does not allow current to pass. On the contrary, when the '1' state has been programmed, the positive charges stored in the upper body region 5a form a screen to the negative potential of the gate 8 and a current of electrons circulates in the (not depleted) region of the lower body 5b.

Two ways of programming the A2RAM memory cell in the '1' state exist. These are based on distinct physical phenomena for generating the majority charge carriers: impact ionisation (II) in the upper body region 5a and band to band tunnelling effect between the drain 4 and the upper body region 5a.

Figure 2A:
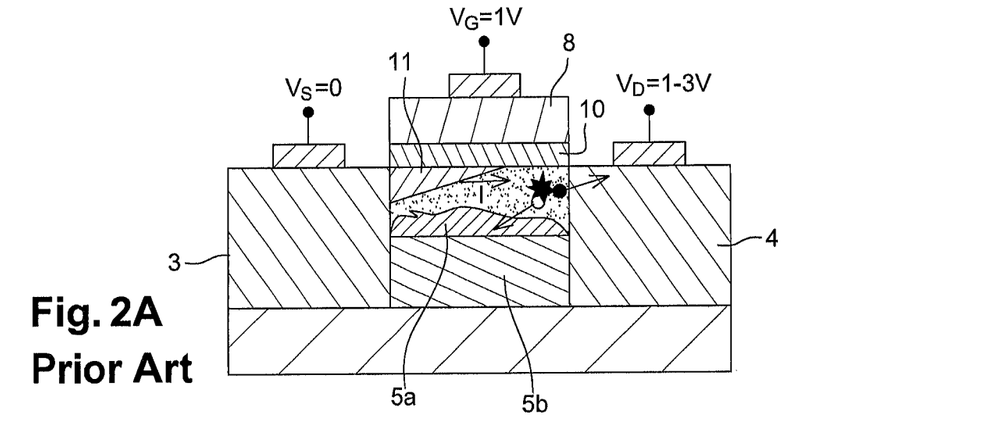
FIGS. 2A and 2B illustrate two modes of programming the A2RAM memory cell according to the prior art.

FIG. 2A schematically represents the writing of a '1' in the memory cell of FIG. 1 (NMOS transistor) by impact ionisation in the upper body region 5a. A relatively high positive potential $V_D$, for example 1 V to 3 V, is applied to the drain 4 of the transistor, whereas the gate 8 is brought to a positive potential $V_G$ (typically 1 V). The source 3 of the transistor is permanently connected to a reference potential, in general zero for the sake of simplicity. These potentials have the effect of biasing the transistor in the on state, and more particularly in saturation regime. Thus, a conductive channel 11 forms in the upper body region 5a and a current of electrons circulates from the source 3 to the drain 4. Given that the difference in potentials between the source 3 and the drain 4 is relatively high, a strong electric field reigns in the pinch zone of the conductive channel 11. Under the effect of this electric field, electrons in circulation create electron-hole pairs by impact in the upper body region 5a. The electrons created are collected by the drain 4 and contribute to the drain current I, whereas the holes remain in the upper body region 5a, trapped by the potential barriers due to the PN junctions between the source 3 and the upper body region 5a, between the drain 4 and the upper body region 5a, and between the upper body region 5a and the lower body region 5b.

This first programming mode has the advantage of being rapid (programming time of the order of one ten of nanoseconds), to the detriment of a high electrical consumption. Furthermore, the strong electric field that reigns in the pinch zone of the channel 11 is responsible for problems of information retention and of reliability of the transistor. Electrons subjected to the electric field are indeed trapped in the gate oxide 10, which can lead to a failure of the memory cell.

Figure 2B:
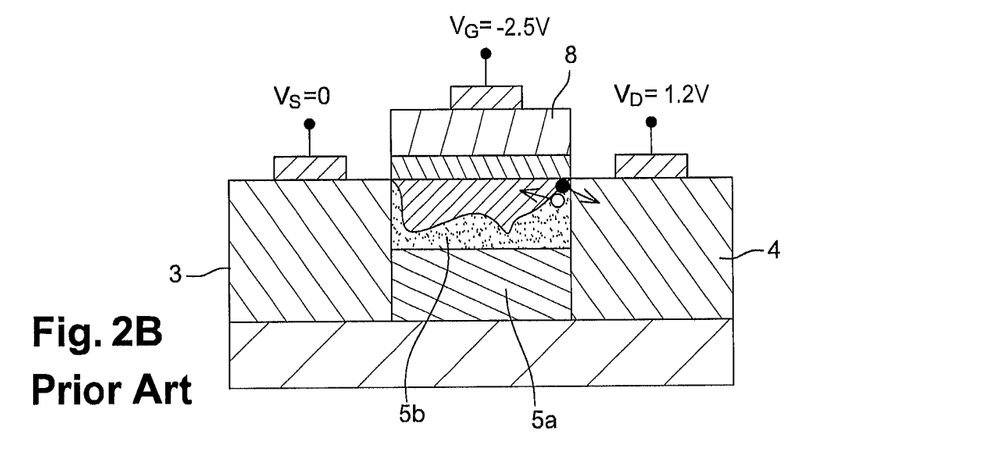

FIG. 2B schematically illustrates the writing of a '1' in the same memory cell by band to band tunnelling effect. In this second programming mode, the transistor is biased in the off state. A highly negative potential $V_G$, comprised between −2.5 V and −3 V, is applied to the gate 8 while the drain 4 is taken to a positive potential $V_D$, for example 1.2 V. The potential applied to the source 3 is still zero. This bias of the transistor modifies the energy band diagram between the drain 4 and the upper body region 5a, thereby allowing the passage, by tunnel effect, of holes from the conduction band of the drain 4 to the valence band of the upper body region 5a (and the passage of electrons from the valence band of the region 5a to the conduction band of the drain 4).

Unlike the first programming mode (impact ionisation), programming by band to band tunnelling effect does not consume much energy, because the transistor is in the "off" state during writing. The band to band tunnelling effect programming time is in contrast much longer, of the order of 1 μs for the aforementioned potential values. The generation of holes by band to band tunnelling effect is all the greater when the electric field in the upper body region 5a is high. Thus, to reach a programming time comparable to that of impact ionisation, it would be necessary to greatly increase the drain-gate voltage in order to maximise the electric field.

Thus, with conventional programming modes, it is observed that it is impossible to reconcile high programming speed and low electrical consumption.

SUMMARY

There therefore exists a need to provide a method for programming a one-transistor memory cell of A2RAM type, which is both rapid and energy efficient. The A2RAM memory cell comprises a source and a drain doped of a first conductivity type, a body region arranged between the source and the drain, and an insulated gate arranged facing the body region. The body region comprises first and second portions extending parallel to the insulated gate between the source and the drain, the first portion being doped of a second conductivity type opposite to the first conductivity type and arranged between the insulated gate and the second portion, doped of the first conductivity type.

According to an aspect of the invention, this need tends to be satisfied by providing a step of biasing the transistor in an off state by means of electrical potentials applied to the drain and the gate, the drain potential and the gate potential being chosen in such a way as to create charge carriers by impact ionisation in the second portion of the body region.

Thus, the programming method according to an aspect of the invention differs from the conventional programming mode by impact ionisation in that the transistor is in the off state (and not in saturation regime) and in that the impact ionisation takes place in the second portion (instead of the first portion).

Furthermore, the programming method according to an aspect of the invention and the conventional programming mode by band to band tunnelling effect have in common the fact that the transistor is biased in the off state. It does not however involve the same mechanism behind the majority of the charge carriers. Indeed, in the programming method according to an aspect of the invention, the charge carriers are essentially created by impact ionisation in the second portion. Since the generation of charge carriers by impact ionisation is quicker than by band to band tunnelling effect, the programming method according to an aspect of the invention allies high programming speed with low electrical consumption (off state of the transistor).

The bias potentials necessary to obtain impact ionisations in the second portion vary as a function of the dimensions of the transistor, for example the gate length or the thickness of the body region. However it is observed that the gate potential applied in the programming method according to an aspect of the invention is lower in absolute value than that normally applied during a conventional programming by band to band tunnelling effect. The memory cell can thus operate with lower voltages than previously, which simplifies the integration of the memory and widens its range of applications to new fields, such as connected objects.

The gate potential may be comprised between 0.5 V and 1.7 V in absolute value, for example between 0.5 V and 1.4 V in an embodiment, and the drain potential may be comprised between 0.85 V and 2.2 V in absolute value, for example between 1 V and 2 V in an embodiment.

The source of the transistor is subjected to a reference potential during the application of the gate and drain potentials. This reference potential is, in an embodiment, zero.

An aspect of the invention also relates to a memory device capable of implementing the programming method described above. This memory device comprises:
- at least one one-transistor DRAM memory cell comprising a source and a drain doped of a first conductivity type, a body region arranged between the source and the drain, and an insulated gate arranged facing the body region, the body region comprising first and second portions extending parallel to the insulated gate between the source and the drain, the first portion being doped of a second conductivity type opposite to the first conductivity type and arranged between the insulated gate and the second portion, doped of the first conductivity type;
- a supply circuit; and
- a bias circuit connecting the supply circuit to the drain and to the gate of the memory cell.

This memory device is noteworthy in that the supply circuit is configured to supply to the drain and to the gate, during programming of the memory cell, drain and gate potentials chosen in such a way as to bias the transistor in an off state and to create charge carriers by impact ionisation in the second portion.

BRIEF DESCRIPTION OF THE FIGURES

Other characteristics and benefits of the invention will become clear from the description that is given thereof below, for indicative purposes and in no way limiting, with reference to the appended figures, among which.

For greater clarity, identical or similar elements are marked by identical reference signs in all of the figures.

DETAILED DESCRIPTION

The programming method described hereafter is intended for a one-transistor dynamic memory cell of A2RAM type, for example that represented by FIG. 1. As indicated previously, the A2RAM memory cell comprises:
- a source 3 and a drain region 4 made of a semiconductor material doped of a first conductivity type;
- a semiconductor body region 5 arranged between the source 3 and drain 4 regions; and
- a gate region 8 arranged facing the body region 5 and electrically insulated therefrom by at least one dielectric layer 10.

For the sake of simplicity, the source 3, drain 4 and gate 8 regions of the transistor will henceforth be designated by the terms "source", "drain" and "gate" respectively.

The body region 5 of the transistor comprises a first portion 5a, sometimes called "channel region" (because the conductive channel of the transistor is liable to form therein) or "upper body region", and a second portion 5b, commonly called "conductive bridge" or "lower body region". These two portions 5a-5b extend parallel to the gate 8 between the source 3 and the drain 4 of the transistor. The first portion 5a, arranged between the gate 8 and the second portion 5b, is doped of a second conductivity type opposite to the first conductivity type. The second portion 5b, the furthest from the gate 8, is doped of the first conductivity type.

The two portions 5a-5b are moreover, in the example of the FIG. 1, in contact with each other and superimposed on a base layer, for example the buried oxide layer 1 of an SOI type substrate 2.

The transistor of the memory cell is for example a NMOS transistor. The source 3, the drain 4 and the conductive bridge 5b are then all N type doped, whereas the channel region 5a is P type doped.

The source 3 and the drain 4 are respectively in contact with source 6 and drain 7 metallisations, connected respectively to the source S and drain D terminals. The gate 8 is connected to a gate terminal G through a gate metallisation 9. The source S, drain D and gate G terminals make it possible to apply electrical potentials, respectively to the source 3, to the drain 4 and to the gate 8, in order to bias the transistor during writing, maintaining and reading phases of the memory cell.

In a conventional manner for a dynamic random access memory cell, the A2RAM memory cell can take the logic states "0" and "1" as a function of the number of charges stored in the body region 5 of the transistor, and more particularly in the channel region 5a. By convention, the '1' state corresponds to the presence of majority charge carriers in the channel region 5a, whereas the '0' state corresponds to the absence of majority charge carriers in this region. Thus, the '0' state and the '1' state of the memory cell could also be called "discharged state" and "charged state".

The inventors have found that by biasing the NMOS transistor in the off state, with a higher negative gate potential (or lower in absolute value) than that used for conventional programming by band to band tunnelling effect, the A2RAM memory cell could be programmed much more rapidly in the logic state '1' without increasing in a significant manner the electrical consumption of the cell.

This observation is somewhat surprising because the band to band tunnelling effect is known to be amplified when (in absolute value) the voltage $V_{DG}$ between the drain 4 and the gate 8 is increased, i.e. in the case of the NMOS transistor by increasing the (positive) potential $V_D$ of the drain 3 and/or by decreasing the (negative) potential $V_G$ of the gate 8. Thus, by increasing the (negative) potential $V_G$ of the gate, a reduction in the charge carrier generation rate by band to band tunnelling effect and consequently a reduction in the programming speed should be expected.

Figure 3A:
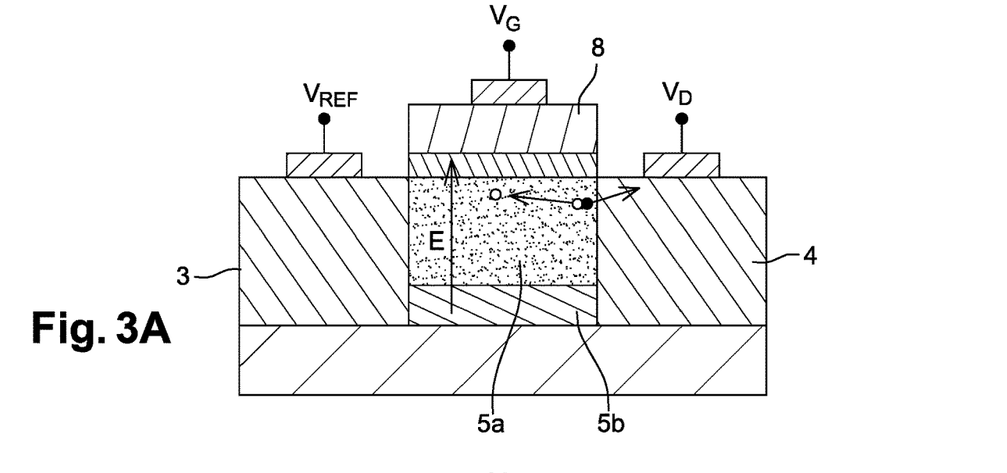
FIGS. 3A to 3C schematically illustrate the behaviour of the A2RAM memory cell of FIG. 1 during a programming method according to an embodiment of the invention.
Figure 3B:
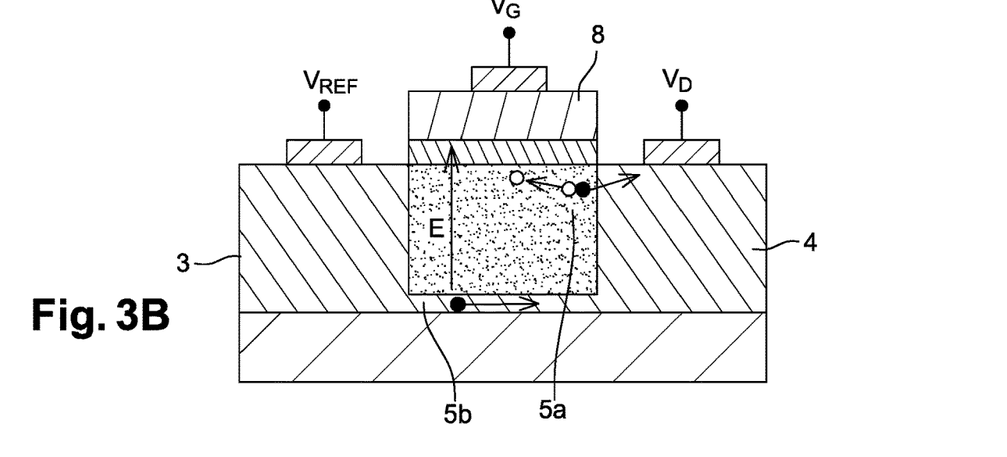
Figure 3C:
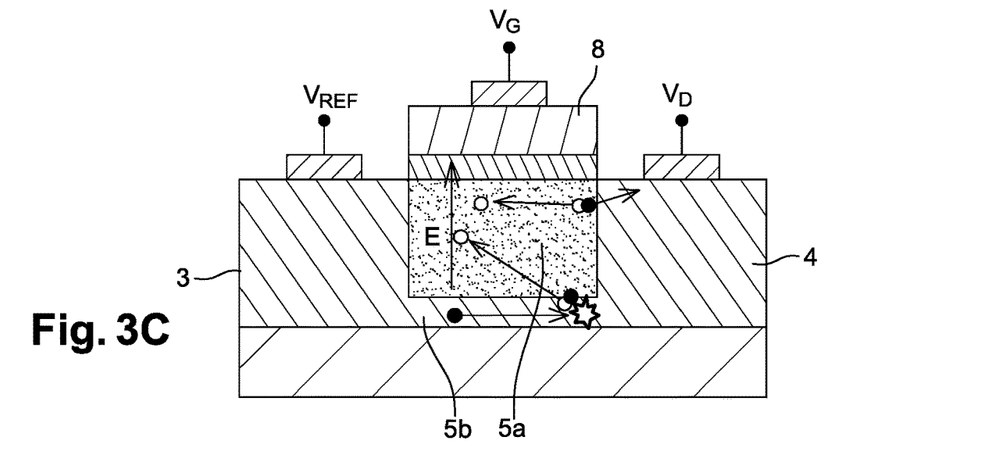

To explain the mechanisms behind this high programming speed of the '1' state, the behaviour of the A2RAM memory cell during the programming method according to an embodiment of the invention has been artificially broken down into three successive phases, illustrated by FIGS. 3A to 3C. The potentials $V_D$ and $V_G$ applied respectively to the drain 4 and the gate 8 of the NMOS transistor are of the order of 1 V or 2 V in absolute values and do not vary during the programming. Furthermore, the source 3 of the transistor is connected to a reference potential $V_{REF}$ during the programming. This reference potential is, in an embodiment, zero (in other words the source 3 is connected to the ground). Alternatively, the source 3 may be subjected to a slightly negative potential $V_{REF}$, of the order of −0.2 V.

The first phase, illustrated by FIG. 3A, is marked by the generation of a small number of charge carriers, by band to band tunnelling effect (hereafter "BTB") between the drain 4 and the channel region 5a of the NMOS transistor. The generation rate of charge carriers by BTB is fixed by the voltage $V_{DG}$ between the drain 4 and the gate 8 ($V_{DG}=V_D-V_G$). Since the gate $V_G$ and drain $V_D$ potentials are low, this generation rate is low. The holes, coming from the conduction band of the drain 4, move under the effect of the gate-drain electric field in the direction of the gate 8 and are stored in the channel region 5a. Furthermore, the vertical electric field E generated by the gate 8 electrostatically cuts the conductive bridge 5b. Consequently, no current circulates between the source 3 and the drain 4 via the conductive bridge 5b. It will be noted that, during this first phase, the low quantity of holes stored in the channel region 5a has no influence on the vertical electric field E perceived by the underlying conductive bridge 5b.

During the second phase (cf. FIG. 3B), the holes generated by BTB continue to accumulate in the channel region 5a and their number becomes sufficient to partially screen the vertical electric field E. The conductive bridge 5b then becomes less depopulated and a low current of electrons circulates in the conductive bridge 5b between the source 3 and the drain 4.

During the third and final phase (cf. FIG. 3C), the holes stored in the channel region 5a are in sufficient number to totally screen the vertical electric field E. The current that circulates in the conductive bridge 5b is then maximum (at the values of $V_S$ and $V_D$ considered). The source-drain electric field gives sufficient speed to the electrons so that they create, by collision with atoms of the conductive bridge 5b, electron-hole pairs. The holes generated by these collisions or impacts are attracted towards the gate 8 and increase in a significant manner the electrical charge stored in the channel region 5a.

Given that the gate potential is relatively low, the vertical electric field E is rapidly screened. In other words, few holes generated by BTB are necessary to observe the circulation of a current in the conductive bridge 5b. Impact ionisation in the conductive bridge 5b is thus the dominant mechanism of generating holes in this programming method.

Thus, the rapidity with which the '1' state is programmed, or written, is explained by an important generation of charge carriers in the conductive bridge 5b via the impact ionisation mechanism.

For a particularly low gate potential, of the order of −1 V, the vertical electric field E is such that the first and second phases are negligible (in terms of number of holes generated). Indeed, in these conditions, a current circulates in the conductive bridge 5b as of the start of programming, such that the holes stored in the channel region 5a are essentially generated by impact ionisation mechanism in the conductive bridge 5b.

Since the programming speed (i.e. the charge carriers generation speed) is high, the gate $V_G$ and drain $V_D$ potentials do not need to be applied for long periods to programme the cell in the '1' state. Preferably, the gate potential $V_G$ is applied for a first duration comprised between 0.1 ns and 10 ns and the drain potential $V_D$ is applied for a second duration greater than or equal to the first duration. In an embodiment, the second duration is also comprised between 0.1 ns and 10 ns.

In an embodiment, the potentials $V_G$ and $V_D$ have the shape of rectangular pulses. Thus, "duration of application" of the gate or drain potential is taken to mean the width of the gate or drain pulses. The programming time of the memory cell corresponds to the duration during which the gate potential $V_G$ is applied, i.e. the smallest pulse width.

TCAD (Technology Computer Aided Design) electrical simulations were performed with the A2RAM memory structure represented in FIG. 1, in order to determine the gate $V_G$ and drain $V_D$ potentials to apply to obtain a high rate of impact ionisation in the conductive bridge 5b, given the technological parameters of the cell.

Figure 4:
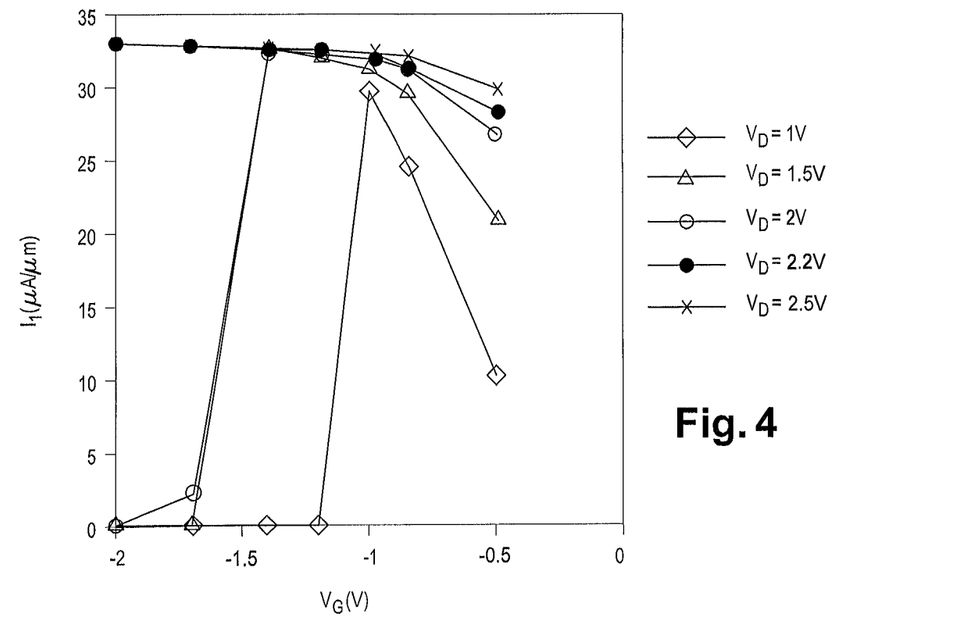
FIG. 4 represents the reading current of the A2RAM memory cell programmed in the '1' state as a function of the gate potential applied during programming, for several values of drain potential applied during programming.

FIG. 4 represents the reading current $I_1$ measured in the memory cell after said cell has been programmed in the '1' state, as a function of the gate $V_G$ and drain $V_D$ potentials having served for the programming. These potentials determine the quantity of charges stored in the channel region 5a. The more numerous the charges stored in the channel region 5a, the less resistive the conductive bridge 5b during the reading of the memory cell and the higher the reading current $I_1$. A high current $I_1$ is thus synonymous with a highly charged channel region 5a, in other words a pronounced and durable programming of the '1' state. The technological parameters of the memory cell are the following:

- gate length $L_G$ (distance separating the source and the drain): $L_G$=80 nm;
- thickness of the channel region 5a: $t_{channel}$=14 nm;
- thickness of the conductive bridge 5b: $t_{bridge}$=22 nm;
- thickness of the dielectric layer 10 (gate oxide): 3.1 nm;
- thickness of the buried oxide layer 1: 10 nm;
- semiconductor material composing the source 3, the drain 4 and the body region 5: silicon (Si);
- material of the dielectric layer 10 (gate oxide) and the buried oxide layer: silicon dioxide ($SiO_2$);
- doping of the source 3 and the drain 4 (N type): $10^{20}$ cm$^{-3}$,
- doping of the channel region 5a (P type): $10^{15}$ cm$^{-3}$, and
- doping of the conductive bridge 5b (N type): $10^{18}$ cm$^{-3}$.

For these simulations, the programming time is chosen excessively long (of the order of 1 ρs) in order to fully charge the channel region 5a, whatever the drain and gate potentials applied (and thus the generation mechanisms brought into play).

For each value of the drain potential $V_D$ comprised between 1 V and 2 V (bounds included), a sudden increase in the reading current $I_1$ is observed when the gate potential $V_G$ is decreased (in absolute value) beyond a certain threshold (said threshold being a function of the drain potential $V_D$). For example, for a drain potential $V_D$ equal to 1.5 V, the reading current $I_1$ is virtually zero when the gate potential $V_G$ is equal to −1.7 V whereas it reaches its maximum for $V_G$=−1.4 V.

As indicated previously, this increase in the reading current $I_1$ (when $V_G$ decreases in absolute value) is contradictory with the electrical behaviour observed during conventional programming by BTB, this behaviour being illustrated in FIG. 4 by the curves at $V_D$=2.2 V and $V_D$=2.5 V. In BTB, the reading current $I_1$ tends indeed to decrease when the gate potential $V_G$ applied during the programming is decreased in absolute value, for a given drain potential $V_D$. The increase in the reading current $I_1$, visible for certain values of drain potential $V_D$ (from 1 V to 2 V in the case of FIG. 4), thus enables to demonstrate that a new charge carriers generation mechanism (other than the band to band tunnelling effect) governs the programming of the '1' state.

Figure 5A:
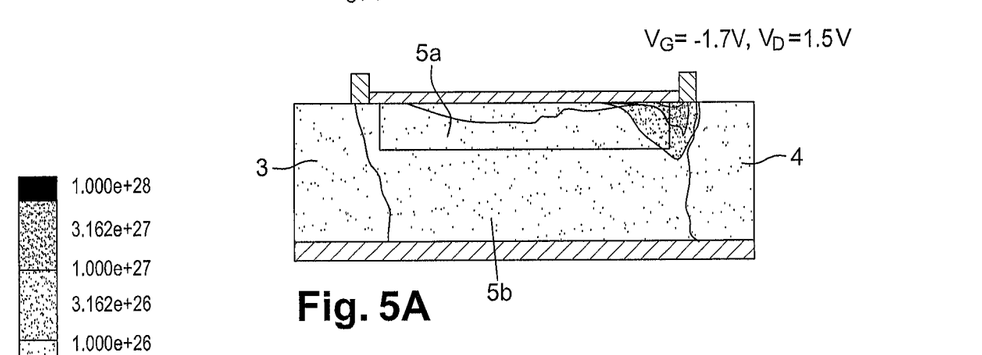
FIGS. 5A and 5B represent the impact ionisation rate in the A2RAM memory cell during the programming thereof, for two different values of gate potential.
Figure 5B:
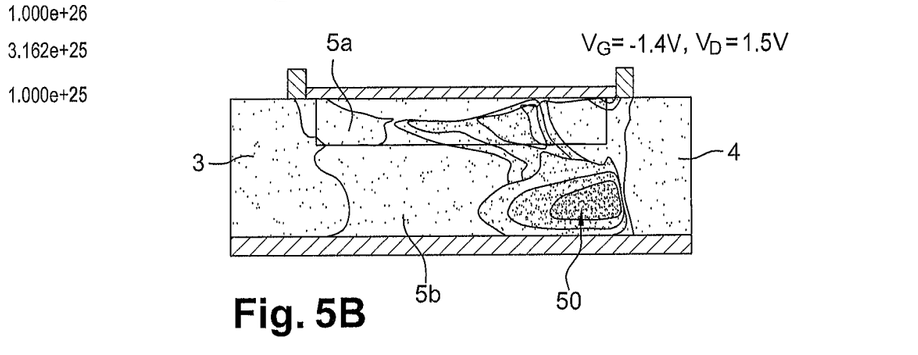

FIGS. 5a and 5B, also obtained by electrical simulation, show the impact ionisation rate in the A2RAM memory structure, respectively during a programming at $V_G$=−1.7 V and $V_D$=1.5V and a programming at $V_G$=−1.4 V and $V_D$=1.5 V. At $V_G$=−1.4 V (FIG. 5b), a high impact ionisation rate in a region 50 of the conductive bridge 5b close to the drain 4 is observed. This implies that a high current circulates in the conductive bridge 5b, from the source 3 to the drain 4. Conversely, at $V_G$=−1.7 V, there is practically no impact ionisation in the conductive bridge 5b, because the vertical electric field E, too strong, electrostatically cuts the conductive bridge 5b.

The values of the gate potential $V_G$ to apply to programme efficiently the memory cell with this new mechanism are those for which the current $I_1$ is high, to be specific those below the aforementioned threshold (for example from $V_G$=−1.4 V to $V_G$=−0.5 V for $V_D$=1.5 V and $V_D$=2 V).

Figure 6:
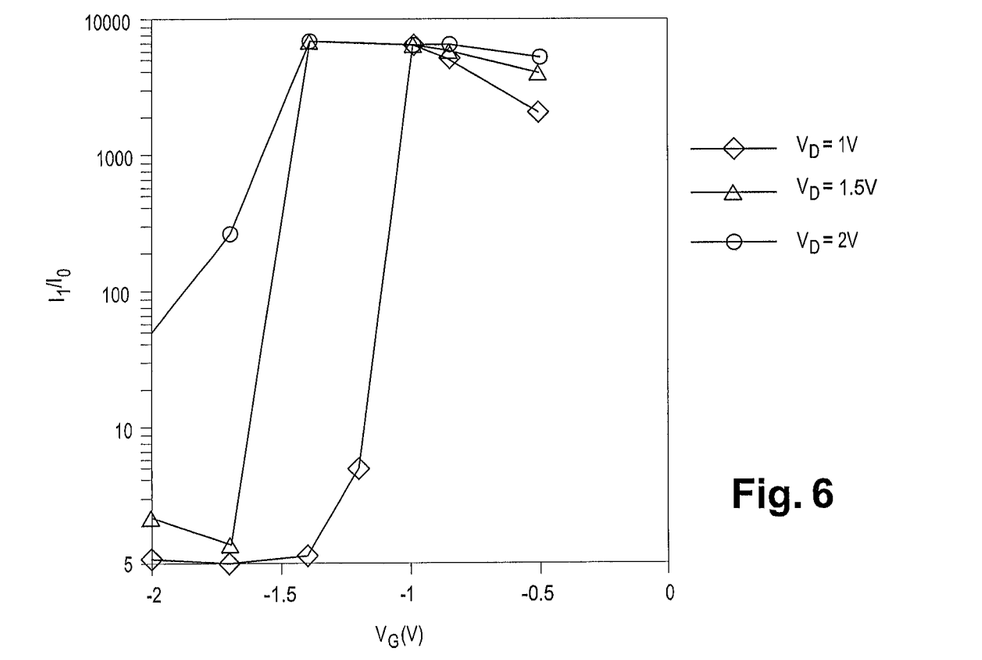
FIG. 6 represents the ratio of the reading current of the memory cell in the '1' state over the reading current of the cell in the '0' state, as a function of the gate potential and the drain potential applied during the programming.

FIG. 6 shows that, for these same potential values, the ratio of the current $I_1$ over the current $I_0$ measured during the reading of the memory cell in the '0' state is much greater than 1000. Thus, in addition to being rapid, the programming method according to an embodiment of the invention guarantees a wide programming window. The logic states '0' and '1' of the memory cell may thus be easily distinguished.

The programming method according to an embodiment of the invention also has the benefit of not causing damage in the A2RAM memory cell, unlike the conventional programming mode by impact ionisation. Here, impact ionisation takes place in the portion of the body the furthest away from the gate. Highly energetic charge carriers thus do not risk being trapped in the gate oxide. The reliability and the retention of the A2RAM memory cell are thus not impacted by successive programmings.

The following table gives, for the memory cell configuration described above (configuration n° 1) and for the other configurations listed below, the gate $V_G$ and drain $V_D$ potential values for which the mechanism of impact ionisation takes place in the conductive bridge 5b and which, consequently, results in a rapid programming of the '1' state. These values were determined using TOAD simulations while taking as criteria:

a reading current of the '1' state sufficiently high to be detected by the peripheral circuits of the memory (typically amplifiers), for example $I_1 \geq 6$ µA/µm, a programming window such that $I_1/I_0 \geq 20$ ($I_0$ being the reading current of the memory cell in the '0' state);

| Configuration | $V_D$ (in V) | $V_G$ (in V) |
|---|---|---|
| no 1 | 2/1.5 | −1.4 to −0.5 |
| ($L_G$ = 80 nm; | 1 | −1 to −0.5 |
| $t_{channel}$ = 10 nm; | | |
| $t_{bridge}$ = 18 nm . . .) | | |
| no 2 | 2.2/2 | −1.2 to −0.5 |
| ($t_{channel}$ = 10 nm) | 1.5 | −1 to −0.5 |
| | 1 | −0.85 |
| no 3 | 2.2 | −1.2 to −0.5 |
| ($t_{bridge}$ = 18 nm) | 2 | −1 to −0.5 |
| | 1.5 | −0.85 to −0.5 |
| no 4 | 1 | −1.7 to −0.85 |
| ($L_G$ = 60 nm) | 0.85 | −1.2 to −0.5 |
| no 5 | 1.5 | −1.7 to −0.5 |
| ($L_G$ = 70 nm) | 1 | −1.4 to −0.5 |
| | 0.85 | −1.2 to −0.5 |

Configuration no2 differs from configuration no1 in that the thickness $t_{channel}$ of the channel region 5a is 10 nm, instead of 14 nm.
Configuration no3 differs from configuration no1 in that the thickness $t_{bridge}$ of the conductive bridge 5b is 18 nm, instead of 22 nm.
Configuration no4 differs from configuration no1 in that the gate length $L_G$ is 60 nm, instead of 80 nm.
Configuration no5 differs from configuration no1 in that the gate length $L_G$ is 70 nm, instead of 80 nm.

It will be appreciated that the programming method according to an embodiment of the invention is not limited to the memory cell structure represented in FIG. 1, or to the configurations of technological parameters given above as an example. In particular, the programming method is applicable to the A2RAM memory cell structures described in the patent EP2764550. The drain and gate potentials could be determined for any other structure and/or configuration, for example, in an embodiment, by means of electrical simulations of TOAD type such as those represented by FIGS. 4, 5A-5B and 6.

Figure 7:
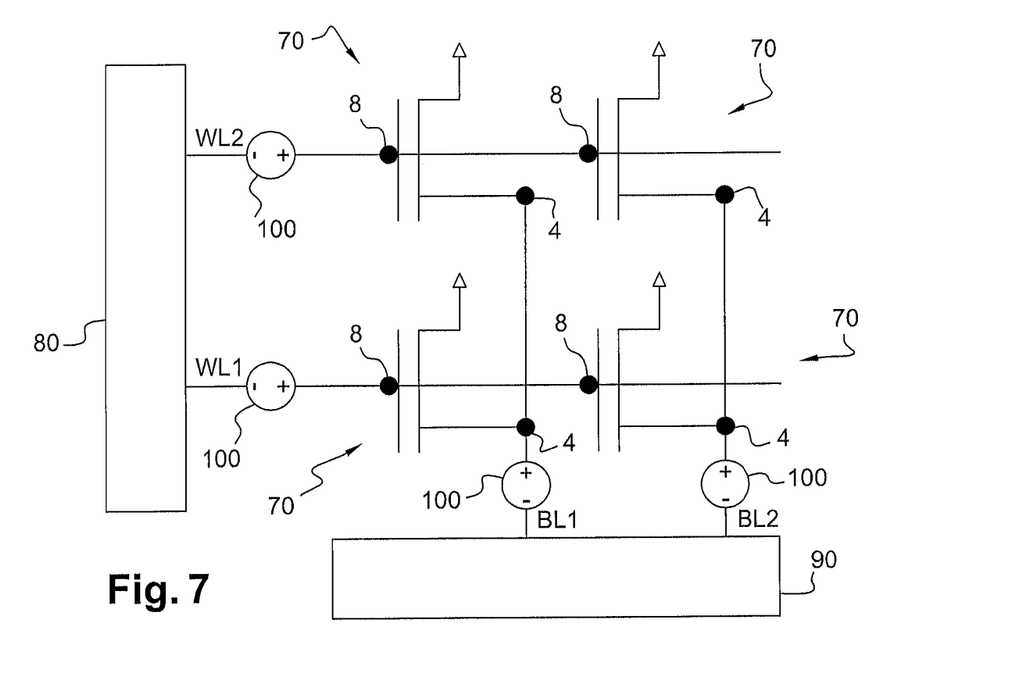
FIG. 7 illustrates an embodiment of a memory device capable of implementing the programming method according to the invention.

Furthermore, the programming method also applies to A2RAM memory cells comprising a NMOS transistor as well as to A2RAM memory cells comprising a PMOS transistor. In the case of a PMOS transistor (i.e. drain, source and conductive bridge of P type, channel region of N type), the gate, drain and source potentials will be simply of opposite sign to those given above in the case of the NMOS transistor.

s FIG. 7 schematically represents a memory device in which the programming method according to an embodiment of the invention may be implemented. This memory device comprises at least one memory cell 70 of A2RAM type, such as described in relation with FIG. 1, and, in an embodiment, a plurality of identical memory cells 70 organised in lines and in columns in the form of an array. As an illustration, the memory device of the FIG. 7 comprises four memory cells 70 distributed into two lines and two columns.

Moreover, the memory device comprises respectively as many wordlines WL and bitlines BL as the array of memory cells has lines and columns. Each wordline WL connects the gates 8 of the memory cells 70 belonging to a same line of the array whereas each bitline BL connects the drains 4 of the memory cells 70 belonging to a same column. Each memory cell 70 is thereby located at the intersection of a bitline BL and a wordline WL.

The different wordlines WL (WL1, WL2, . . . ) of the memory device are furthermore connected to a first addressing circuit 80, whereas the different bitlines BL (BL1, BL2, . . . ) are connected to a second addressing circuit 90.

The addressing circuits 80-90 and the wordlines WL and bitlines BL together form a bias circuit of the memory cells. This bias circuit is coupled to a supply circuit, comprised of a plurality of voltage sources 100. The voltage sources 100 are programmable, in order to modulate the potential delivered as a function of the operation to carry out (reading, writing, maintaining, etc.). The electrical potentials delivered by these voltage sources 100 are chosen to implement the programming method according to the invention. Each bitline BL or wordline WL may be connected to a dedicated voltage source 100. The potentials may thus be conveyed up to the drains 4 and gates 8 of the cells, by the bitlines BL and wordlines WL respectively.

Finally, the memory device comprises a controller (not represented) configured to trigger a programming in the '1' state of one of the memory cells 70. This controller sends control signals to the addressing circuits 80-90 in order that they select the bitlines BL and wordlines WL corresponding to the cell to programme. In response to these control signals, the addressing circuits 80-90 connect the selected bitlines BL and wordlines WL to the corresponding voltage sources 100.

In addition to activating the bitline WL corresponding to the cell to programme, the second addressing circuit 90 is capable of reading and amplifying the drain current of the selected memory cell.

The invention claimed is:

1. A method for programming a one-transistor DRAM memory cell, the memory cell comprising a source and a drain doped of a first conductivity type, a body region arranged between the source and the drain, and an insulated gate arranged facing the body region, the body region comprising first and second portions extending parallel to the insulated gate between the source and the drain, the first portion being doped of a second conductivity type opposite to the first conductivity type and arranged between the insulated gate and the second portion, doped of the first conductivity type, the programming method comprising biasing the one-transistor in an off state by means of electrical potentials applied to the drain and the gate,
wherein the drain potential and the gate potential are chosen in such a way as to create charge carriers by impact ionization in the second portion.

2. The method according to claim 1, wherein the gate potential is applied for a first duration comprised between 0.1 ns and 10 ns and wherein the drain potential is applied for a second duration greater than or equal to the first duration.

3. The method according to claim 2, wherein the second duration is between 0.1 ns and 10 ns.

4. The method according to claim 1, wherein the gate potential is comprised between 0.5 V and 1.7 V in absolute value, and wherein the drain potential is comprised between 2.2 V and 0.85 V in absolute value.

5. The method according to claim 4, wherein the gate potential is comprised between 0.5 V and 1.4 V and wherein the drain potential is comprised between 1 V and 2 V.

6. The method according to claim 1, wherein the source of the one-transistor is subjected to a reference potential.

7. The method according to claim 6, wherein the reference potential is zero.

8. A memory device comprising:
at least one one-transistor DRAM memory cell comprising a source and a drain doped of a first conductivity type, a body region arranged between the source and the drain, and an insulated gate arranged facing the body region, the body region comprising first and second portions extending parallel to the insulated gate between the source and the drain, the first portion being doped of a second conductivity type opposite to the first conductivity type and arranged between the insulated gate and the second portion, doped of the first conductivity type;

a supply circuit; and a bias circuit connecting the supply circuit to the drain and to the gate of the memory cell;

wherein the supply circuit is configured to supply to the drain and to the gate, during programming of the memory cell, drain and gate potentials chosen in such a way as to bias the one-transistor in an off state and to create charge carriers by impact ionization in the second portion.

* * * * *